BALANCED MIXER CIRCUIT AND INDUCTIVE DEVICE USABLE THEREIN

Filed Jan. 31, 1964 2 Sheets-Sheet 1

INVENTOR.
ALLEN F. PODELL
BY James and Franklin
ATTORNEYS

June 20, 1967 A. F. PODELL 3,327,220

BALANCED MIXER CIRCUIT AND INDUCTIVE DEVICE USABLE THEREIN

Filed Jan. 31, 1964 2 Sheets-Sheet 2

INVENTOR.
ALLEN F. PODELL
BY James and Franklin
ATTORNEYS 3,327,220

BALANCED MIXER CIRCUIT AND INDUCTIVE DEVICE USABLE THEREIN

Allen F. Podell, Berkeley, Calif., assignor to Anzac Electronics, Inc., Norwalk, Conn., a corporation of Connecticut Filed Jan. 31, 1964, Ser. No. 342,337
34 Claims. (Cl. 325—446)

The present invention relates to a balanced mixer circuit, and to novel inductive devices usable therein.

This application is a continuation-in-part of my prior application Ser. No. 226,847, filed Sept. 28, 1962, now abandoned and entitled, "Balanced Mixer Circuit and Inductive Device Usable Therein."

Mixer circuits—circuits in which two AC inputs are combined to produce an output signal the frequency of which represents the sum or difference of the input frequencies—are in wide-spread use, as for example, in the production of intermediate frequencies in superheterodyne receiving sets, the intermediate frequency representing the difference between the carrier frequency of a received signal and the frequency produced by a local oscillator. The advantages of using mixer circuits which are balanced—in which the input and output are connected to mid-points of a network having a pair of similar branches, in each of which branches a mixing device such as a crystal is employed—are well known. Primary among these advantages are the fact that two mixing devices are used, each of which takes but half the load, thus extending the current- and power-carrying capacities of the circuit, and that the local oscillator voltage is not applied to the signal input. However, the use of balanced mixer circuits becomes increasingly difficult the higher the frequencies involved, and at frequencies on the order of 10–1000 megacycles prior art balanced mixer circuits either operate unsatisfactorily or else are so complex as to be excessively expensive and insufficiently reliable. In the usual circuit arrangement for producing a balanced mixer circuit a center-tapped transformer is provided between the local oscillator input and the signal input, and at high frequencies such a transformer no longer operates effectively.

It is the prime object of the present invention to devise a simplified balanced mixer circuit which has exceptionally good performance charcteristics even at very high frequencies. This is accomplished by eliminating the center-tapped transformer which has been a major source of trouble insofar as high frequency performance is concerned, and instead using, in appropriate relation to the other circuitry, a novel type of inductive device either to produce an effective balance between the two branches of the mixer circuit or to maintain or improve that balanced condition, or both.

The novel inductive device in question comprises a body of high magnetic permeability material such as ferrite provided with a central passage, the outer diameter of that body being much greater than the inner diameter thereof, the length of the body preferably being less than one quarter of the wave length, in the material of which the body is formed, of the alternating current frequencies involved. Extending through the central opening in said body are a pair of parallel conductors which are in transmission line relation to one another at the frequencies involved. These simple devices function in a manner comparable to transformers, and may be connected in the balanced circuit to perform the same functions as prior art center-tapped transformers, as well as to perform other functions.

A pair of these novel inductive devices may be located respectively in each of the parallel branches of a balanced mixer circuit between the mixer devices and the local oscillator signal, thereby to balance the local oscillator input to those mixing devices. Alternatively, one of said novel inductive devices may be connected in a single one of the parallel branches of the balanced circuit in order to add inductance to one of the wires in that branch and thus prevent undesired shunting thereof. In addition, one of said novel inductive devices may be utilized in a circuit connected between the parallel branches and ground in order to ensure, or to assist in ensuring, that the branches are effectively balanced. Particularly good power handling capacity is provided when the intermediate frequency currents in this latter circuit are by-passed to ground and when the other currents flowing therein flow to ground through a resistor of appropriate magnitude.

To the accomplishment of the above, and to such other objects as may hereinafter appear, the present invention relates to the construction and arrangement of balanced mixer circuits, and of novel inductive devices used therein, all as defined in the appended claims, and as described in this specification, taken together with the accompanying drawings in which:

Figure 1:
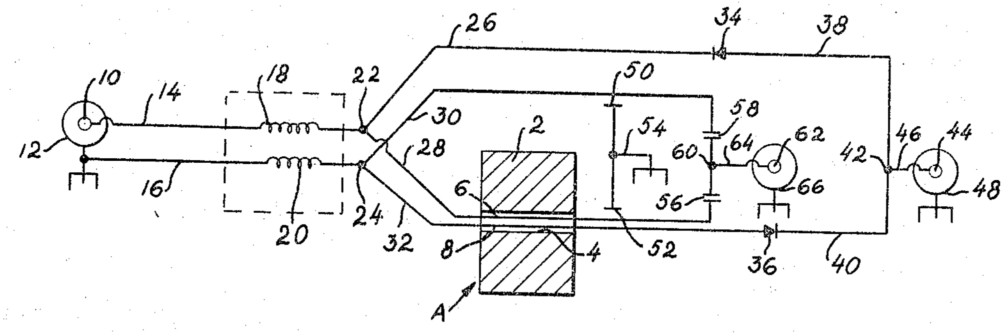
FIG. 1 is a circuit diagram of one type of balanced mixer circuit according to the present invention.

The novel inductive devices which are used in the circuits of the present invention are generally designated A, and comprises a body 2 of very high permeability material such as high performance ferrite, said body 2 having a narrow central passage 4 therethrough. A pair of conductors 6 and 8 extend through the central passage 4, those conductors 6 and 8 being so spatially related to one another as to, in effect, constitute a transmission line at the frequencies of the voltages applied to those conductors. The conductors 6 and 8 are, for purposes of ready illustration, shown in the drawings as parallel to and alongside one another, in the nature of a Lecher wire, but it will be understood that they could be in a concentric line relationship rather than a side-by-side parallel line relationship. Moreover, since the interconnection between the two conductors 6 and 8 constitutes an important feature in the present invention, when two individual conductors 6 and 8 are employed the interconnection between them could be enhanced by twisting them around one another as they extend through the passage 4.

The geometry of the body 2 is of critical significance if the device A is to perform its desired functions at high frequencies. Specifically, the greater the outer diameter of the body 2 with relation to its inner diameter (the diameter of the central passage 4), the more effective is the device A. The outer diameter of the body 2 should be at least three times the inner diameter thereof, and is preferably between six and twenty times such inner diameter. The optimum length of the body 2 is determined by the operating characteristics of the circuit in which the device A is used, and particularly by the frequency of the voltages involved. The length of the body 2 should be less than one quarter of the wave length, in the material of which the body 2 is formed, of the frequency involved. The shorter the length of the body 2, the better is the high frequency performance of the device, and its minimum length is determined by that which is found necessary, on an empirical basis, to offer sufficient impedance to the local oscillator signal at the lowest frequency desired. These devices A constitute impedances which are exceptionally effective at high frequencies and which, by reason of the close coupling between the conductors 6 and 8 which extend through their central passage 4, may effectively be used in balanced mixer circuits which employ transmission line techniques in their design.

Purely by way of example, a typical such device A for use with frequencies on the order of 10–1000 megacycles per second may have an outer diameter of 5/16 inch, an inner diameter of 0.030 inch, and a length of about 1/2 inch, that length approaching 1/4 wave length in the material of the body 2 at 1000 megacycles per second.

In the balanced mixer circuit of FIG. 1, the local oscillator signal is applied across points 10 and 12, to which leads 14 and 16 are respectively connected, the point 12 being grounded. Portions 18 and 20 of the leads 14 and 16 respectively are wound together in a bifilar manner to define an inductance, and extend to points 22 and 24 respectively. Two leads 26 and 28 extend from point 22, and two leads 30 and 32 extend from point 24. The leads 26 and 30 form one branch of the balanced circuit, while the leads 28 and 32 form the other parallel branch thereof, the leads 26 and 30 being so spatially related as to define a transmission line at the frequencies involved, and the leads 28 and 32 being similarly spatially related to constitute a transmission line at the frequencies involved. The leads 26 and 32 extend respectively to appropriate ends of mixing devices 34 and 36, those mixing devices, as here specifically shown, being constituted by type 1N21C mixing crystals, oriented as shown in FIG. 1. The opposite ends of the mixing devices 34 and 36 are connected by leads 38 and 40 respectively to point 42, to which terminal 44 of the signal input is connected by lead 46. The terminal 48 of the signal input is connected by lead 46. The terminal 48 of the signal input is connected to ground. Feed-through capacitors 50 and 52 connect leads 30 and 28 respectively to ground via lead 54. The ends of leads 28 and 30 are connected via capacitors 56 and 58 to mid-point 60, the other being connected to output terminal 62 by lead 64, the other terminals 66 of the output circuit being connected to ground. The capacitors 56 and 58 may have a value of .01 mf. and the feed-through capacitors 50 and 52 may have a value of 100 mf. The inductance defined by the bifilar windings 18 and 20 cooperates with the feed-through capacitors 50 and 52 to define a tank circuit tuned to the intermediate or output frequency.

It will be appreciated that the circuit of FIG. 1, as thus far described, is nominally balanced, so that the mixing devices 34 and 36 will equally share the load, and so that the local oscillator input at points 10, 12 has no effect on the signal input at points 44 and 48. However, the lead 28, which is conductively connected to the ungrounded local oscillator input lead 14, is bypassed to ground by the feed-through capacitor 52, and thus, if uncompensated for, would have the effect of shunting an appreciable portion of the local oscillator input to ground, thus preventing that portion of the input from reaching the mixing devices. Hence a portion of the lead 28, between the point 22 and the feed-through capacitor 52, passes through an inductive device A of the type above described, said inductive device A increasing the inductance of the conductor 6, and thus minimizing the effect of the feed-through capacitor 52 on the lead 28. At the same time the inductance of the conductor 8, between the point 24 and the feed-through capacitor 52, is also, and correspondingly, increased, thereby maintaining the proper transmission line relationship between the conductors 6 and 8. As a result the circuit of FIG. 1 will function effectively and efficiently for mixing purposes even at frequencies in the 1000 megacycles per second range, and with intermediate frequency output signals on the order of 30 megacycles per second.

Figure 2:
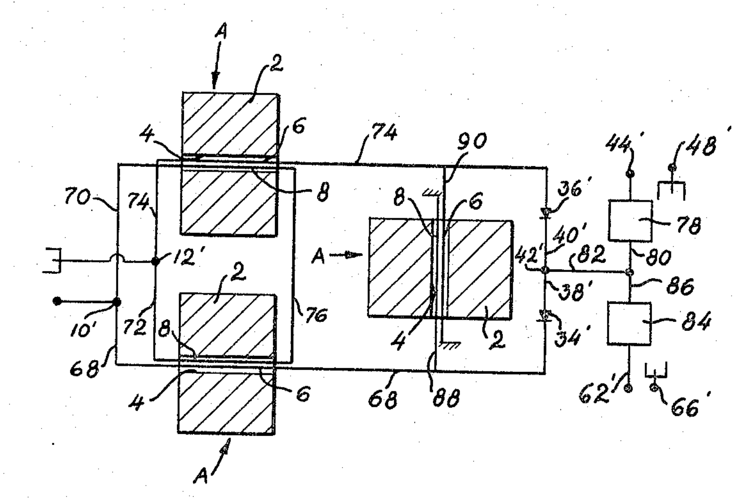
FIG. 2 is a circuit diagram of another embodiment thereof.

In the circuit of FIG. 2 the local oscillator input is applied across points 10' and 12', point 12' being grounded. Leads 68 and 70 extend from point 10' and leads 72 and 74 extend from point 12'. Leads 68 and 72 are in transmission line relation to one another and pass through the central passage 4 of an inductive device A of the type above described. Leads 70 and 74 are similarly in transmission line relation to one another and extend through the central passage 4 of another inductive device A of the type above described. Leads 68 and 74 extend on to appropriate terminals of the mixing devices 34' and 36' respectively, these devices again being shown as mixer crystals oriented in the manner disclosed, the opposite terminals of the mixer devices 34' and 36' being connected by leads 38' and 40' respectively to point 42'. The leads 70 and 72, after they pass through their respective inductive devices A, are connected to one another by means of lead 76. The signal input is connected across points 44' and 48', the latter being grounded, point 44' being connected to point 42' by filter 78 and leads 80 and 82, the filter 78 passing signal frequencies but rejecting intermediate or output frequencies. The output is taken across points 62' and 66', point 66' being grounded and point 62' being connected to point 42' by a filter 84 and leads 86 and 82. The filter 84 will pass intermediate or output frequencies but will reject signal frequencies.

The circuit as thus far described will function as a balanced mixer circuit, the pair of inductive devices A, one connected in each branch of the balanced circuit, functioning to balance the local oscillator input to the mixing devices 34' and 36', the interaction between the leads 70 and 74 passing through the upper inductance devices A and the leads 68 and 72 passing through the lower inductance device A, and the high inductance, and hence impedance, imparted to those conductors by reason of the highly magnetically permeable bodies 2, producing a balancing result comparable to that of a center-tapped transformer, but with exceptionally good operating characteristics at high frequencies, such as those on the order of 10–1000 megacycles per second.

Because of the effect of the signal input on the mixing devices 34' and 36', a tendency will exist, in the thus disclosed circuit, for an unbalance to occur between the leads 68 and 74 adjacent the mixing devices 34' and 36'. To counteract this tendency, a pair of leads 88 and 90 are connected between ground and the leads 68 and 74 respectively at points on said leads 68 and 74 between the mixing devices 34', 36' and the inductive devices A. These leads 88 and 90 extend alongside one another in transmission line relationship and extend through the central passage 4 of a third inductive device A of the type above described. The linkage or coupling between those portions of the leads 88 and 90 which extend through that inductive device A, together with the high inductive values imparted to those leads by reason of the body 2 of that inductive device A, results in effectively maintaining the leads 68 and 74 in truly balanced condition.

Figure 3:
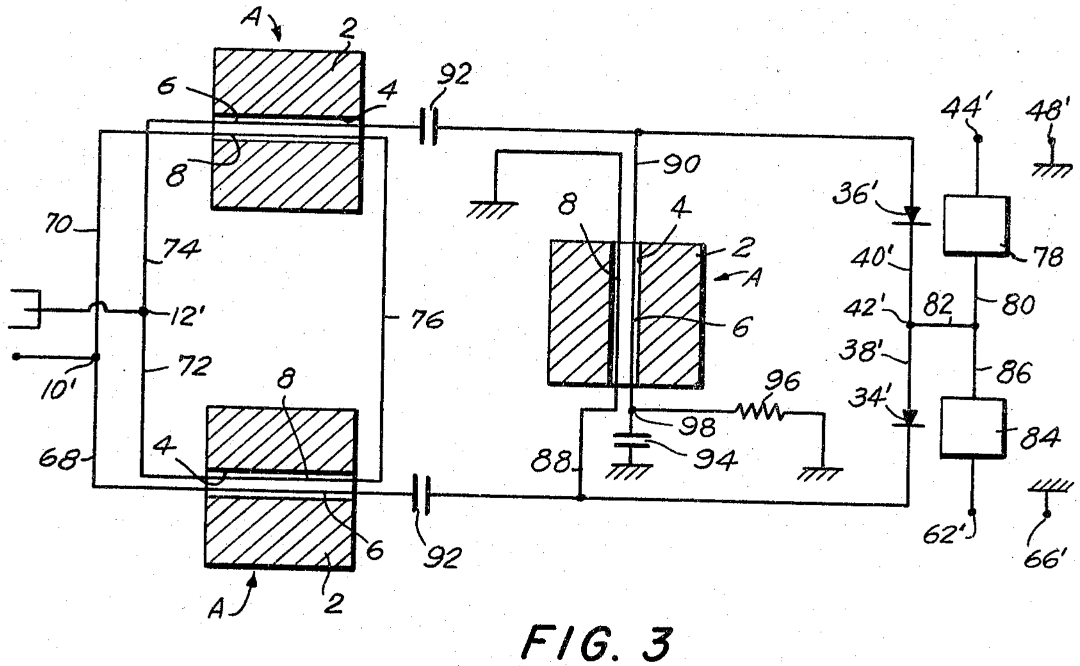
FIG. 3 is a circuit diagram of the embodiment of FIG. 2 modified in order to increase its power-handling capacity.

The power-handling capacity of the circuit of FIG. 2 can be appreciably increased if it is modified as shown in FIG. 3, in which figure elements corresponding to those shown in FIG. 2 are identified by the same reference numerals as are utilized in FIG. 2. As disclosed in FIG. 3, capacitors 92 are connected in the two branches of the circuit between the inductive devices A and the points where the leads 88 and 90 respectively are connected thereto. The value of the capacitors 92 is such as to effectively by-pass the lowest frequency involved. Purely by way of example, if the minimum frequency is 1000 megacycles, the capacitors 92 may have a value of 500 mmf. One of the leads 88 and 90, here specifically shown as the lead 90, is by-passed to ground by capacitor 94. The value of capacitor 94 is such as to by-pass the intermediate frequency to ground. For a 1000 mc. intermediate frequency the value of the capacitor 94 may be 3300 mmf., and in other installations in which the disclosed circuit can be used the value of the capacitor 94 may vary between 1000 and 6000 mmf. in accordance with the above criteria. A resistor 96 is connected between ground and point 98 on the lead 90, the point 98 being disposed between the by-pass capacitor 94 and the inductive device A. The value of this resistor will vary from installation to installation, and is more or less empirically determined by the following procedure: The value of the resistor is increased, while the circuit is in operation, until the mixing devices 34' and 36' begin to conduct in reverse direction, after which the value of the resistor 96 is decreased slightly. The value of the resistor is such that the mixing devices 34', 36' do not conduct in reverse direction, but it is close to the value such that reverse conduction will occur. By way of specific example, when the mixing devices 34' and 36' are constituted by 1N21 point contact diodes, which have a 4 volt breakdown value in the reverse direction, the significant operation frequency is 1000 mc., there are 100 milliwatts of oscillator input and 100 milliwatts of signal input, the resistor 96 may have a value of 75 ohms.

The presence of the resistor 96 in the circuit shown in FIG. 3 produces a quite significant difference in the power output of the mixer. In a commercial installation circuits of the type of FIG. 2 were able to produce an eight milliwatt power output, whereas under similar conditions a circuit according to FIG. 3 produced a power output of 15–25 milliwatts. The reason for this increase in power-handling capacity is not fully understood, and may be considered as a fully empirical invention. The following explanation is advanced tentatively. The passage of DC current components through the resistor 96 produces a voltage drop therein which back-biases the mixing devices 34', 36'. Because of this back-biasing effect they do not commence current conduction at the beginning of each half cycle, but instead conduct only after the voltage has reached a value sufficient to overcome the back-biasing. Accordingly the mixing devices 34', 36' carry current only during portions of the total duty cycle, rather than over the entire duty cycle, thereby reducing the proportion of the total power handled by the mixer circuit which must pass through the mixing devices 34', 36'. In addition, it is believed that the presence of the resistor 96 gives rise to a more favorable combination of impedance matching and harmonic generation within one overall circuit. Whatever the explanation may be, the observed increase in power-handling capacity when the resistor 96 is employed is quite significant, and enables the mixers to be used, for example, for the direct drive of TWT or similar amplifiers without recourse to intermediate power amplification.

While balanced mixer circuits utilizing transmission line techniques have been used in the past, such circuits have been exceedingly complicated, expensive to fabricate, difficult to design, delicate to keep in balance, and have lacked reliability. Cores of high permeability material having central passages through which conductors extend have also been known, but such devices have not been constructed as here disclosed. Moreover, such prior art inductive devices have not previously been used in balanced mixer circuits for the purposes, and in the manners, here disclosed. Through the use of these specially designed and novel inductive devices A in balanced mixer circuits utilizing transmission line techniques, simple and dependable circuits are produced which function effectively and efficiently in a mixing manner and which exhibit high frequency operating characteristics previously thought to be unattainable in any practical way. In addition, particularly in connection with the embodiment of FIG. 3, the power-handling capacity of these mixer circuits is quite high, thus minimizing the need for additional circuit components in a given installation.

While but a limited number of embodiments of the present invention have been here specifically disclosed, it will be apparent that many variations may be made therein, all within the scope of the invention as defined in the following claims.

I claim:

1. In combination, a body of high magnetic permeability having a central passage therethrough, the ratio of outer diameter to inner diameter of said body being greater than three to one, a pair of conductors extending to and through said passage and being otherwise remote from said body and means for applying high frequency alternating current to said conductors, said conductors being in transmission line relationship to one another at the frequency involved.

2. In combination, a body of high magnetic permeability having a central passage therethrough, the ratio of outer diameter to inner diameter of said body being greater than three to one, a pair of conductors extending to and through said passage, and being otherwise remote from said body, and means for applying high frequency alternating current to said conductors, said conductors being in transmission line relationship to one another at the frequency involved, the length of said body being less than one-quarter wave length of said frequency in the material of which said body is formed.

3. In combination, a body of high magnetic permeability having a central passage therethrough, the ratio of outer diameter to inner diameter of said body being between six to one and twenty to one, a pair of conductors extending to and through said passage and being otherwise remote from said body, and means for applying high frequency alternating current to said conductors, said conductors being in transmission line relationship to one another at the frequency involved.

4. In combination, a body of high magnetic permeability having a central passage therethrough, the ratio of outer diameter to inner diameter of said body being between six to one and twenty to one, a pair of conductors extending to and through said passage and being otherwise remote from said body, and means for applying high frequency alternating current to said conductors, said conductors being in transmission line relationship to one another at the frequency involved, the length of said body being less than one-quarter wave length of said frequency in the material of which said body is formed.

5. A mixer circuit comprising a high frequency alternating current oscillator input, a high frequency alternating current signal input, a network comprising two parallel branches between said inputs with a mixer device in each branch, said network comprising at least one pair of parallel conductors in transmission line relation to one another at the frequencies involved, an intermediate frequency output connected to said network, and at least one body of high magnetic permeability having a central passage therethrough, said pair of parallel conductors extending to and through said passage and being otherwise remote from said body.

6. The circuit of claim 5, in which each of said parallel branches comprises a different pair of parallel conductors in transmission line relationship with one another, and a body of high magnetic permeability for each of said pairs of said conductors, to and through the central passages of which bodies said respective pairs of conductors extend, said conductors being otherwise remote from said body.

7. In the circuit of claim 6, a pair of conductors connected between each of said branches respectively and ground, said conductors being in transmission line relationship with one another, and a body of high magnetic permeability having a central passage through which said conductors extend.

8. In the circuit of claim 6, a pair of conductors connected to each of said branches respectively, said conductors being in transmission line relationship with one another, a body of high magnetic permeability having a central passage through which said conductors extend, a by-pass capacitor connected between ground and a point on one of said conductors on the opposite side of said body from said branch, and a resistor connected between ground and a point on said one of said conductors located between said body and said by-pass capacitor.

9. In the circuit of claim 6, a pair of conductors connected to each of said branches respectively, said conductors being in transmission line relationship with one another, a body of high magnetic permeability having a central passage through which said conductors extend, a by-pass capacitor connected between ground and a point on one of said conductors on the opposite side of said body from said branch, and a resistor connected between ground and a point on said one of said conductors located between said body and said by-pass capacitor, the value of said resistor being slightly less than that required to cause said mixer devices to conduct in reverse direction.

10. The circuit of claim 5, in which said pair of parallel conductors extend respectively from opposite ones of said branches to ground.

11. The circuit of claim 8, in which each of said parallel branches comprises a different pair of parallel conductors in transmission line relationship with one another, means by-passing one of said conductors in one of said branches to ground, the pair of conductors of which said by-passed conductor is a part extending through said central passage of said body.

12. A mixer circuit comprising a high frequency alternating current oscillator input, a high frequency alternating current signal input, a network comprising two parallel branches between said inputs with a mixer device in each branch, said network comprising at least one pair of parallel conductors in transmission line relation to one another at the frequencies involved, an intermediate frequency output connected to said network, and at least one body of high magnetic permeability having a central passage therethrough, said pair of parallel conductors extending to and through said passage and being otherwise remote from said body, the ratio of inner diameter to outer diameter of said body being greater than three to one.

13. A mixer circuit comprising a high frequency alternating current oscillator input, a high frequency alternating current signal input, a network comprising two parallel branches between said inputs with a mixer device in each branch, said network comprising at least one pair of parallel conductors in transmission line relation to one another at the frequencies involved, an intermediate frequency output connected to said network, and at least one body of high magnetic permeability having a central passage therethrough, said pair of parallel conductors extending to and through said passage and being otherwise remote from said body, the ratio of inner diameter to outer diameter of said body being greater than three to one, the length of said body being less than one-quarter wave length of said frequency in the material of which said body is formed.

14. The circuit of claim 13, in which each of said parallel branches comprises a different pair of parallel conductors in transmission line relationship with one another, and a body of high magnetic permeability for each of said pairs of said conductors, to and through the central passages of which bodies said respective pairs of conductors extend, said conductors being otherwise remote from said body.

15. In the circuit of claim 14, a pair of conductors connected between each of said branches respectively and ground, said conductors being in transmission line relationship with one another, and a body of high magnetic permeability having a central passage through which said conductors extend.

16. In the circuit of claim 14, a pair of conductors connected to each of said branches respectively, said conductors being in transmission line relationship with one another, a body of high magnetic permeability having a central passage through which said conductors extend, a by-pass capacitor connected between ground and a point on one of said conductors on the opposite side of said body from said branch, and a resistor connected between ground and a point on said one of said conductors located between said body and said by-pass capacitor.

17. In the circuit of claim 14, a pair of conductors connected to each of said branches respectively, said conductors being in transmission line relationship with one another, a body of high magnetic permeability having a central passage through which said conductors extend, a by-pass capacitor connected between ground and a point on one of said conductors on the opposite side of said body from said branch, and a resistor connected between ground and a point on said one of said conductors located between said body and said by-pass capacitor, the value of said resistor being slightly less than that required to cause said mixer devices to conduct in reverse direction.

18. The circuit of claim 13, in which said pair of parallel conductors extend respectively from opposite ones of said branches to ground.

19. The circuit of claim 13, in which each of said parallel branches comprises a different pair of parallel conductors in transmission line relationship with one another, means by-passing one of said conductors in one of said branches to ground, the pair of conductors of which said by-passed conductor is a part extending through said central passage of said body.

20. A mixer circuit comprising a high frequency alternating current oscillator input, a high frequency alternating current signal input, a network comprising two parallel branches between said inputs with a mixer device in each branch, said network comprising at least one pair of parallel conductors in transmission line relation to one another at the frequencies involved, an intermediate frequency output connected to said network, and at least one body of high magnetic permeability having a central passage therethrough, said pair of parallel conductors extending to and through said passage and being otherwise remote from said body, the ratio of inner diameter to outer diameter of said body being between six to one and twenty to one.

21. A mixer circuit comprising a high frequency alternating current oscillator input, a high frequency alternating current signal input, a network comprising two parallel branches between said inputs with a mixer device in each branch, said network comprising at least one pair of parallel conductors in transmission line relation to one another at the frequencies involved, an intermediate frequency output connected to said network, and at least one body of high magnetic permeability having a central passage therethrough, said pair of parallel conductors extending to and through said passage and being otherwise remote from said body, the ratio of inner diameter to outer diameter of said body being between six to one and twenty to one, the length of said body being less than one-quarter wave length of said frequency in the material of which said body is formed.

22. The circuit of claim 21, in which each of said parallel branches comprises a different pair of parallel conductors in transmission line relationship with one another, and a body of high magnetic permeability for each of said pairs of said conductors, to and through the central passages of which bodies said respective pairs of conductors extend, said conductors being otherwise remote from said body.

23. The circuit of claim 21, in which said pair of parallel conductors extend respectively from opposite ones of said branches to ground.

24. The circuit of claim 21, in which each of said parallel branches comprises a different pair of parallel conductors in transmission line relationship with one another, means by-passing one of said conductors in one of said branches to ground, the pair of conductors of which said by-passed conductor is a part extending through said central passage of said body.

25. A mixer circuit comprising a high frequency alternating current oscillator input, a high frequency alternating current signal input, a network comprising two parallel branches between said inputs with a mixer device in each branch, said network comprising at least one pair of parallel conductors in transmission line relation to one another at the frequencies involved, an intermediate frequency output connected to said network, and a pair of conductors connected between each of said branches respectively and ground, said conductors being in transmission line relationship with one another.

26. The circuit of claim 25, in which each of said parallel branches comprises a different pair of parallel conductors in transmission line relationship with one another.

27. A mixer circuit comprising a high frequency alternating current oscillator input, a high frequency alternating current signal input, a network comprising two parallel branches between said inputs with a mixer device in each branch, each of said parallel branches comprising a different pair of parallel conductors in transmission line relationship with one another at the frequencies involved, an intermediate frequency output connected to said network, a body of high magnetic permeability for each of said pairs of said conductors, each of said bodies having a central passage therethrough, said respective pairs of parallel conductors extending through the passages in said bodies respectively, a pair of conductors connected between each of said branches respectively and ground, said conductors being in transmission line relationship with one another, and a body of high permeability having a central passage through which said conductors extend.

28. A mixer circuit comprising a high frequency alternating current oscillator input, a high frequency alternating current signal input, a network comprising two parallel branches between said inputs with a mixer device in each branch, said network comprising at least one pair of parallel conductors in transmission line relation to one another at the frequencies involved, an intermediate frequency output connected to said network, and at least one body of high magnetic permeability having a central passage therethrough, said pair of parallel conductors extending through said passage, said pair of parallel conductors extending respectively from opposite ones of said branches to ground.

29. A mixer circuit comprising a high frequency alternating current oscillator input, a high frequency alternating current signal input, a network comprising two parallel branches between said inputs with a mixer device in each branch, said network comprising at least one pair of parallel conductors in transmission line relation to one another at the frequencies involved, an intermediate frequency output connected to said network, and at least one body of high magnetic permeability having a central passage therethrough, said pair of parallel conductors extending through said passage, each of said parallel branches comprising a different pair of parallel conductors in transmission line relationship with one another, and means by-passing one of said conductors in one of said branches to ground, the pair of conductors of which said by-passed conductors is a part extending through said central passage of said body.

30. A mixer circuit comprising a high frequency alternating current oscillator input, a high frequency alternating current signal input, a network comprising two parallel branches between said inputs with a mixer device in each branch, said network comprising at least one pair of parallel conductors in transmission line relation to one another at the frequencies involved, an intermediate frequency output connected to said network, and at least one body of high magnetic permeability having a central passage therethrough, said pair of parallel conductors extending through said passage, the ratio of inner diameter to outer diameter of said body being greater than three to one, the length of said body being less than one-quarter wave length of said frequency in the material of which said body is formed, said pair of parallel conductors extending respectively from opposite ones of said branches to ground.

31. A mixer circuit comprising a high frequency alternating current oscillator input, a high frequency alternating current signal input, a network comprising two parallel branches between said inputs with a mixer device in each branch, said network comprising at least one pair of parallel conductors in transmission line relation to one another at the frequencies involved, an intermediate frequency output connected to said network, and at least one body of high magnetic permeability having a central passage therethrough, said pair of parallel conductors extending through said passage, the ratio of inner diameter to outer diameter of said body being greater than three to one, the length of said body being less than one-quarter wave length of said frequency in the material of which said body is formed, each of said parallel branches comprising a different pair of parallel conductors in transmission line relationship with one another, and means by-passing one of said conductors in one of said branches to ground, the pair of conductors of which said by-passed conductor is a part extending through said central passage of said body.

32. A mixer circuit comprising a high frequency alternating current oscillator input, a high frequency alternating current signal input, a network comprising two parallel branches between said inputs with a mixer device in each branch, said network comprising at least one pair of parallel conductors in transmission line relation to one another at the frequencies involved, an intermediate frequency output connected to said network, and at least one body of high magnetic permeability having a central passage therethrough, said pair of parallel conductors extending through said passage, the ratio of inner diameter to outer diameter of said body being between six to one and twenty to one, the length of said body being less than one-quarter wave length of said frequency in the material of which said body is formed, said pair of parallel conductors extending respectively from opposite ones of said branches to ground.

33. A mixer circuit comprising a high frequency alternating current oscillator input, a high frequency alternating current signal input, a network comprising two parallel branches between said inputs with a mixer device in each branch, said network comprising at least one pair of parallel conductors in transmission line relation to one another at the frequencies involved, an intermediate frequency output connected to said network, and at least one body of high magnetic permeability having a central passage therethrough, said pair of parallel conductors extending through said passage, the ratio of inner diameter to outer diameter of said body being between six to one and twenty to one, the length of said body being less than one-quarter wave length of said frequency in the material of which said body is formed, each of said parallel branches comprising a different pair of parallel conductors in transmission line relationship with on another, means by-passing one of said conductors in one of said branches to ground, the pair of conductors of which said by-passed conductor is a part extending through said central passage of said body.

34. A mixer circuit comprising a high frequency alternating current oscillator input, a high frequency alternating current signal input, a network comprising two parallel branches between said inputs with a mixer device in each branch, each of said parallel branches comprising a different pair of parallel conductors in transmission line relationship with one another at the frequencies involved, an intermediate frequency output connected to said network, a body of high magnetic permeability for each of said pairs of conductors, each of said bodies having a central passage therethrough, said respective pairs of parallel conductors extending through the passages in said bodes respectively, the ratio of inner diameter to outer diameter of said bodies being greater than three to one, the length of said bodies being less than one-quarter wave length of said frequency in the material of which said bodies are formed, a pair of conductors connected between each of said branches respectively and ground, said conductors being in transmission line relationship with one another, and a body of high magnetic permeability having a central passage through which said conductors extend.

No references cited.

KATHLEEN H. CLAFFY, *Primary Examiner.*

R. S. BELL, *Assistant Examiner.*